(12) United States Patent
Kerlin et al.

(10) Patent No.: US 7,074,082 B2
(45) Date of Patent: Jul. 11, 2006

(54) PLUGGABLE MODULE AND RECEPTACLE

(75) Inventors: Harold W. Kerlin, Port Royal, PA (US); Edward J. Bright, Middletown, PA (US)

(73) Assignee: Tyco Electronics Corporation, Middletown, PA (US)

(*) Notice: Subject to any disclaimer, the term of this patent is extended or adjusted under 35 U.S.C. 154(b) by 0 days.

(21) Appl. No.: 10/300,433

(22) Filed: Nov. 20, 2002

(65) Prior Publication Data

US 2003/0104725 A1 Jun. 5, 2003

Related U.S. Application Data

(62) Division of application No. 09/728,708, filed on Dec. 1, 2000, now Pat. No. 6,517,382.

(60) Provisional application No. 60/192,932, filed on Mar. 29, 2000, provisional application No. 60/168,475, filed on Dec. 1, 1999.

(51) Int. Cl.
*H01R 13/648* (2006.01)

(52) U.S. Cl. ..................................................... 439/607

(58) Field of Classification Search ............... 439/607, 439/954, 571, 572, 573, 439, 609, 352, 610, 439/357

See application file for complete search history.

(56) References Cited

U.S. PATENT DOCUMENTS

| 5,083,945 | A | * | 1/1992 | Miskin |
| 5,171,161 | A | * | 12/1992 | Kachlic ........................ 439/352 |
| 5,352,133 | A | * | 10/1994 | Sampson ..................... 439/357 |
| 5,470,259 | A | * | 11/1995 | Kaufman et al. ............ 439/607 |
| 5,511,992 | A | * | 4/1996 | Thalhammer ............... 439/609 |
| 5,522,731 | A | * | 6/1996 | Clark et al. ................. 439/108 |
| 5,865,646 | A | | 2/1999 | Ortega et al. ............... 439/607 |
| 5,879,173 | A | * | 3/1999 | Poplawski et al. .......... 439/138 |
| 5,928,035 | A | * | 7/1999 | Jankowsky et al. ......... 439/607 |
| 5,934,939 | A | * | 8/1999 | Thenaisie et al. ........... 439/607 |
| 6,047,172 | A | | 4/2000 | Babineau et al. ........... 455/300 |
| 6,179,627 | B1 | | 1/2001 | Daly et al. ................. 439/76.1 |
| 6,335,869 | B1 | | 1/2002 | Branch et al. .............. 361/816 |
| 6,416,361 | B1 | * | 7/2002 | Hwang ....................... 439/607 |
| 6,419,523 | B1 | * | 7/2002 | Jones et al. ................. 439/607 |
| 6,443,768 | B1 | * | 9/2002 | Dirkers et al. .............. 439/607 |
| 6,478,622 | B1 | * | 11/2002 | Hwang ....................... 439/607 |
| 6,485,322 | B1 | | 11/2002 | Branch et al. .............. 439/357 |
| 6,554,646 | B1 | * | 4/2003 | Casey ........................ 439/607 |

* cited by examiner

*Primary Examiner*—Phuong Dinh

(57) ABSTRACT

A receptacle for a pluggable module includes an electrically conductive housing having connection members which are configured to electrically connect the housing to a circuit board. The housing has a cavity and an open front for receiving the module into the cavity. The housing has a resilient latch tab that cooperates with a latching member on the module to secure the module in the cavity. The latch tab is electrically conductive and is integrally formed with the housing.

14 Claims, 8 Drawing Sheets

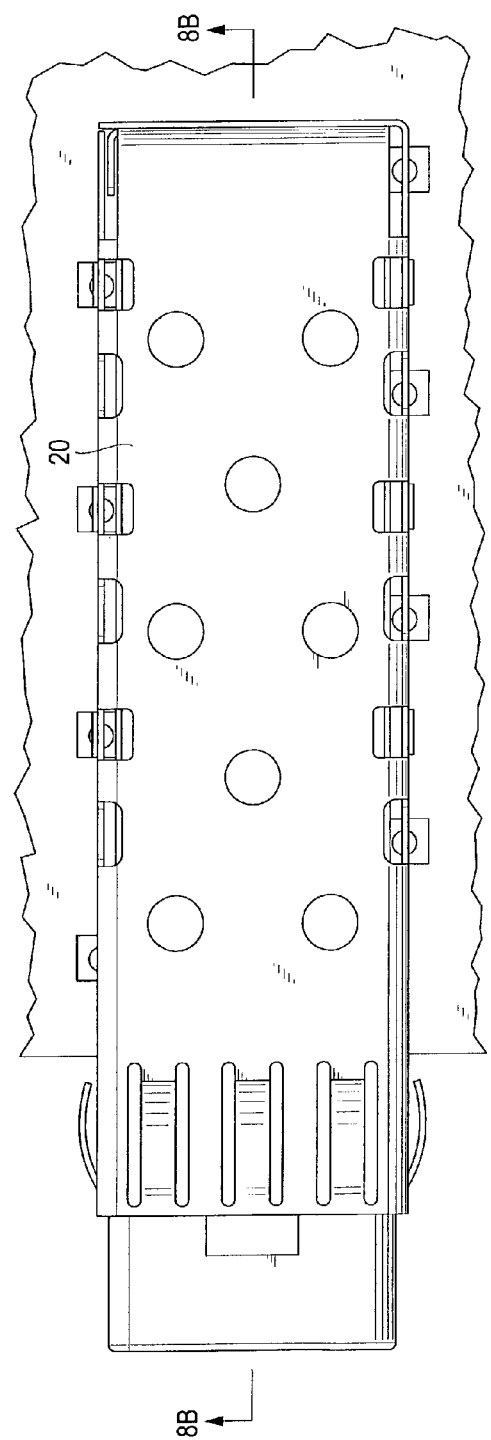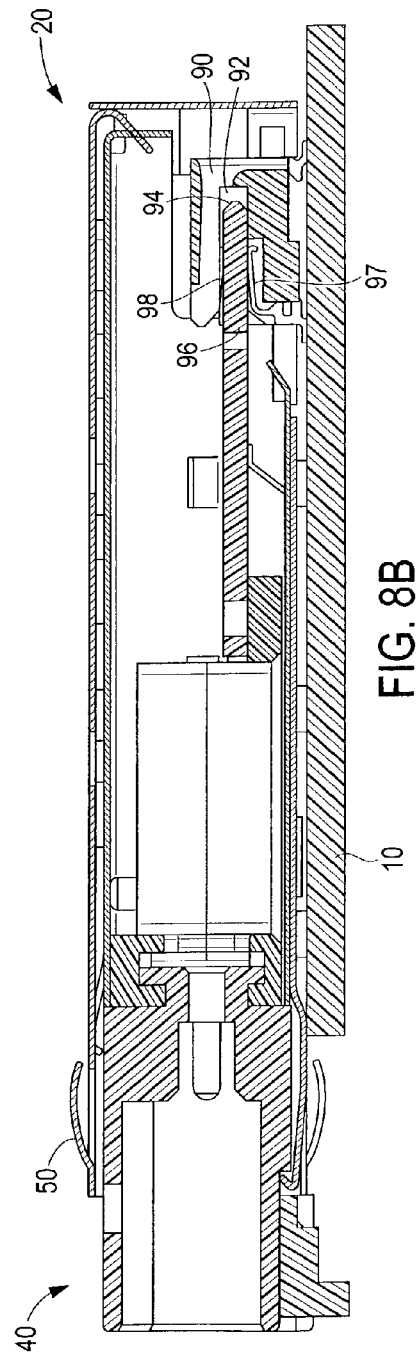

PLUGGABLE MODULE AND RECEPTACLE

CROSS-REFERENCE TO RELATED APPLICATIONS

This application is a division of U.S. application Ser. No. 09/728,708 filed Dec. 1, 2000, now U.S. Pat. No. 6,517,382, which claims the benefit of U.S. Provisional Application No. 60/192,932 filed Mar. 29, 2000, and U.S. Provisional Application No. 60/168,475 filed Dec. 1, 1999.

FIELD OF THE INVENTION

The present invention relates generally to electronic connector systems and, more specifically, to low-profile connector systems for pluggable electronic modules, such as transceiver modules for high speed fiber optical and copper communications.

BACKGROUND OF INVENTION

Historically, electrical and opto-electric modules have been connected to printed circuit boards with solder pins. Conventional approaches for soldering the pins to the circuit board include reflow soldering and hand soldering. Although solder reflow is an effective technique for electrically connecting a module to a circuit board, the heat required to achieve reflow tends to be detrimental to heat sensitive components within the module, such as plastic optical components which tend to warp or otherwise distort at high temperatures. Furthermore, to ensure that modules are capable of withstanding the environmental conditions associated with reflow soldering, the industry utilizes high temperature materials that add cost to the modules. Since most modules will be used in more moderate climates (e.g., an air-conditioned office building), the modules are therefore "over-engineered" simply to ensure that they can withstand the reflow soldering process.

To avoid exposing the module to harsh conditions during reflow soldering, often electronic modules are hand soldered instead to a printed circuit board. The need for hand soldering, however, dramatically increases the cost of system comprising such modules.

Aside from the problems associated with soldering the module to the circuit board, there is the added inconvenience that, if a single module fails on a circuit board, which may support many such modules, the entire circuit board must be removed for service.

Therefore, there is a need for a solderless connection of a module to a circuit board. To this end, several pluggable module designs and standards have been introduced in which a pluggable module plugs into a receptacle which is electronically connected to a host circuit board. For example, a well-known type of transceiver developed by an industry consortium is known as a gigabit interface converter (GBIC) or serial optical converter (SOC) and provides an interface between a computer and a data communication network such as Ethernet or Fibre Channel. These standards offer a generally robust design which has been well received in industry.

Although these conventional pluggable designs have been used successfully in the past, they tend to be unsuitable for miniaturization which is an ever-constant objective in the industry. It is desirable to miniaturize transceivers in order to increase the port density associated with the network connection, such as, for example, switch boxes, cabling patch panels, wiring closets, and computer I/O. Recently, a new standard has been promulgated and is referred to herein as the small form factor (SFF) standard which specifies an enclosure height of 9.8 mm and a width of 13.5 mm and a minimum of 20 electrical input/output connections. In addition to miniaturizing the module, it is also desirable to increase its operating frequency. For example, applications are quickly moving from the sub-gigabit realm to well over a gigabit. Conventional pluggable module configurations, however, cannot meet these parameters.

Miniaturizing a module while maintaining or even increasing its operating speed, presents a number of design problems particularly in applications in which data transmission rates are high, e.g., in the range of 1–10 Gbs (Gigabits/second). Of particular concern is reducing electromagnetic interference (EMI) emissions. Due to FCC regulations, there is a need not only to minimize the EMI emissions of the module, but also to contain the EMI emissions of the host system in which the module is mounted regardless of whether a module is plugged in to the receptacle. In conventional designs, this EMI shielding was achieved by using conductive spring-loaded door which was capable of swinging shut and closing the receptacle when the module was removed. Conventional receptacles also had spring clips to ground the receptacles to the bezel opening of the host system. Providing space for spring-loaded doors and spring clips on the receptacle tends to be problematic if not impossible in miniaturized configurations. Additionally, the small size presents problems in dissipating heat from the module and incorporating traditional mechanisms for ejecting and retaining the module and for electrically connecting the module to the host circuit board.

Therefore, there is a need for a module design that conforms to the SFF standard while minimizing EMI emissions and providing convenient pluggable operation. The present invention fulfills this need among others.

SUMMARY OF INVENTION

The present invention provides a pluggable module and receptacle system that facilitates miniaturization and high operating frequencies by effectively shielding EMI emissions to eliminate leaks and conduct EMI to ground, and by synergistically using components to eliminate conventional discrete mechanisms and their attendant bulk.

EMI shielding is achieved by implementing one or more features that serve to minimize gaps through which EMI can escape, and/or to enhance grounding of the receptacle. One such feature is a receptacle housing in which all of its sides except the front comprise conductive walls for blocking EMI. This way, when the receptacle is mounted within a host system and is exposed to the host system's internal EMI, all of the housing sides exposed to the EMI, including the back and the bottom, are conductive and thus suitable for conducting the EMI to ground. Preferably, the housing is electrically connected to ground through a number of elongated connection members. Another feature for minimizing gaps through which EMI can escape is the use of containment members. Containment members extend downward from the receptacle, preferably between elongated connection members, and essentially form a picket fence along with the connection members to prevent EMI emissions.

In addition to minimizing gaps through which EMI can escape, the module and receptacle system of the present invention is extremely well suited for conducting EMI to ground. This grounding is achieved principally by grounding contacts on the front end of the module and grounding tabs around the front opening on the receptacle. This way, the grounding contacts provide a grounding path from the module to the receptacle and the grounding tabs, in turn, provide a grounding path from the receptacle to the host chassis. Preferably, the grounding tabs are cut from the receptacle housing walls and elongated such that the grounding tabs are longer than the respective section of the wall from which each grounding tab was derived. Such a configuration prevents the grounding tabs from being deflected into the receptacle cavity. This arrangement is particularly preferable in small form factor configurations in which there is no room in the receptacle cavity to accommodate anything other than the module. To enhance the grounding of the module to the receptacle while the module is being inserted therein, the receptacle housing defines rows of ventilation holes, which, in turn, define uninterrupted ground paths therebetween. By spacing the grounding contacts on the module to correspond to the spacing of the grounding paths on the receptacle, the grounding contacts will slide along the grounding paths during insertion and withdrawal of the module from the receptacle, thereby ensuring that the module is continuously grounded during the insertion and withdrawal. Further enhancements to grounding include a latch which serves not only to retain the module within the receptacle, but also to provide a grounding path from the front of the module to the front of the receptacle and to provide an extra picket in the EMI fence as mentioned above.

The module and receptacle system of the present invention also employs components of the receptacle synergistically to avoid separate mechanisms and components which add bulk and cost to the system. For example, rather than using a conventional connector to effect connection of the module to the receptacle connector, a card edge connection configuration is used. Additionally, the ejection mechanism uses a resilient back portion of the receptacle to urge the module out once the latch is released. The more efficient use of components within the module and receptacle provide for the elimination of other components and thus a general reduction in the system's bulk. This naturally facilitates miniaturization which, as mentioned above, is an ever-present objective in module design.

Accordingly, one aspect of the invention is a receptacle having a housing that shields EMI on all sides exposed to the EMI of the host system. In a preferred embodiment, the receptacle comprises: (a) a housing having a front; a back wall, a top wall, a bottom wall, and side walls and defining a cavity for receiving a module, the bottom wall having a bottom opening to receive a receptacle connector, the front having a front opening to receive the module, the walls comprising a conductive material; and (b) a plurality of elongated connection members extending down from the housing past the bottom wall and adapted for electrical connection to a host circuit board such that the walls are electrically connected to the host circuit board.

Another aspect of the invention is a receptacle for receiving a module therein. The receptacle comprises an electrically conductive housing having connection members which are configured to make electrical connection with a circuit board. The housing defines a cavity and has an open front for receiving the module into the cavity, and the housing has a resilient latch tab that cooperates with a latching member on the module to secure the module in the cavity.

DESCRIPTION OF DRAWINGS

The invention will now be described by way of example with reference to the accompanying drawings wherein:

FIGS. 8A and 8B show a top view and a cross-sectional view, respectively, of the transceiver module in the shield such that a circuit board within the transceiver module is electrically connected to the mating connector on the host circuit board.

DESCRIPTION OF A PREFERRED EMBODIMENT

Figure 1:
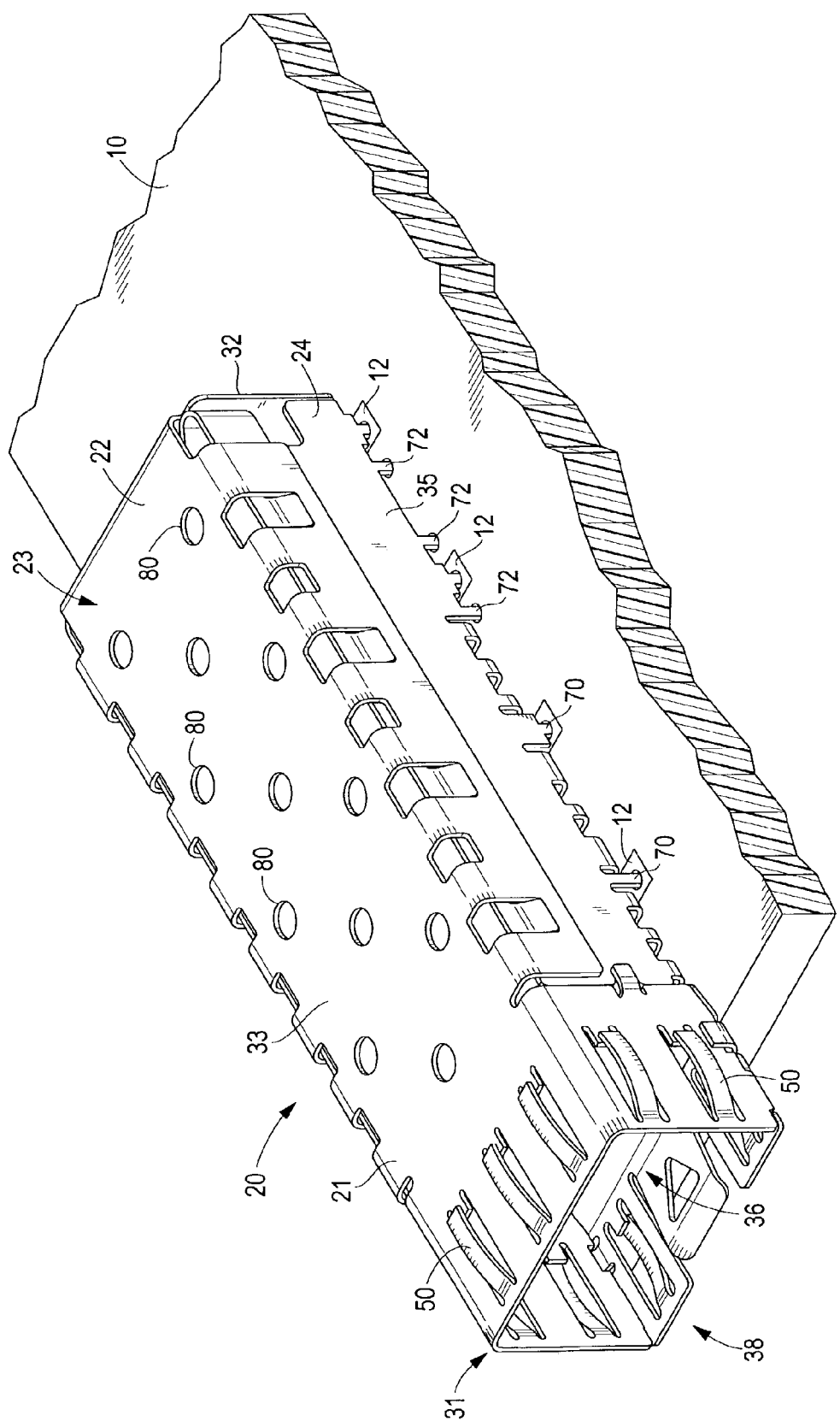
FIG. 1 shows a top perspective view of the shield as mounted on a host circuit board.

The present invention provides a robust module and receptacle system which is suitable for miniaturization and which provides adequate EMI shielding and ventilation while facilitating easy connection/disconnection to a mating connector. As shown in FIG. 1, a receptacle 20 of the present invention is mounted to a host circuit board 10. The host circuit board is mounted in a host system such as a router or computer. The host system typically comprises a conductive chassis (not shown) having a bezel through which the receptacle is mounted such that the receptacle is electrically connected to the bezel. The host system typically has other components mounted to its circuit board which generate EMI that would escape through the bezel if not for the receptacle system of the present invention.

Figure 9:
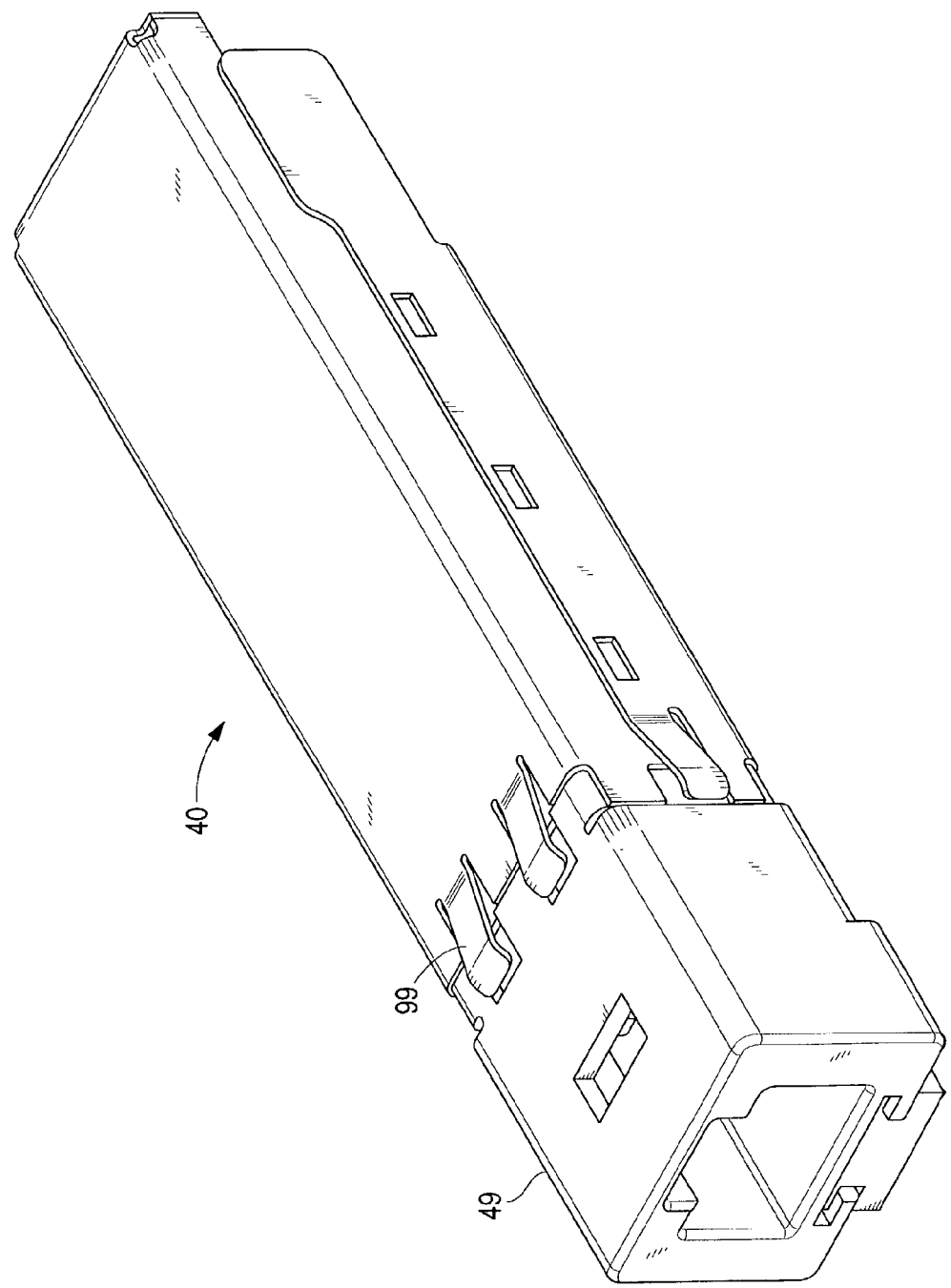
FIG. 9 shows a top perspective view of the module.

The module 40 of the present invention is shown in FIG. 9 and is configured to be inserted in the receptacle 20. In general, the module and receptacle system may be used in any application requiring an interface between a host system and electrical or optical signals. The module interfaces to the host system through a receptacle connector 90 (see FIG. 7). The module interfaces to an optical fiber or electrical conductor through a connector interface 49. Preferably, the connector interface 49 comprises a mechanism that cooperates with a fiber or cable assembly to hold the assembly secure to the module. Examples of connector interfaces include adapters for the MT-RJ style connectors and the HSSDC2 copper connectors offered by Tyco Electronics Corporation (Harrisburg, Pa.). The connector interface 49 depicted in FIG. 9 is an adapter interface for an MT-RJ style fiber connector.

Figure 2:
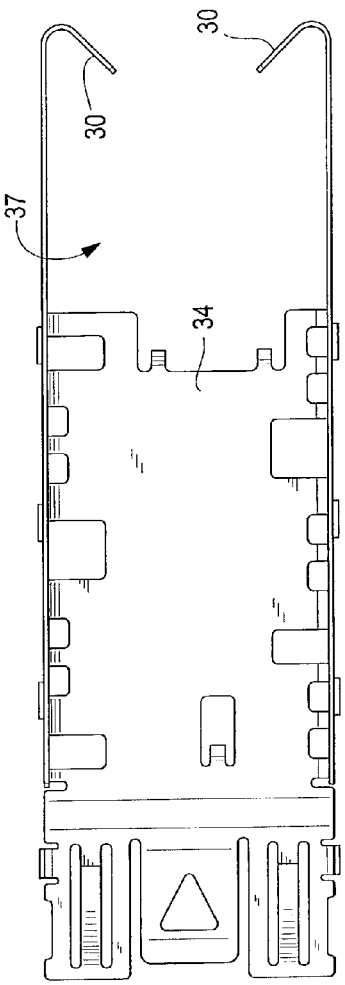
FIG. 2 shows a top view of a lower portion of the shield.
Figure 3:
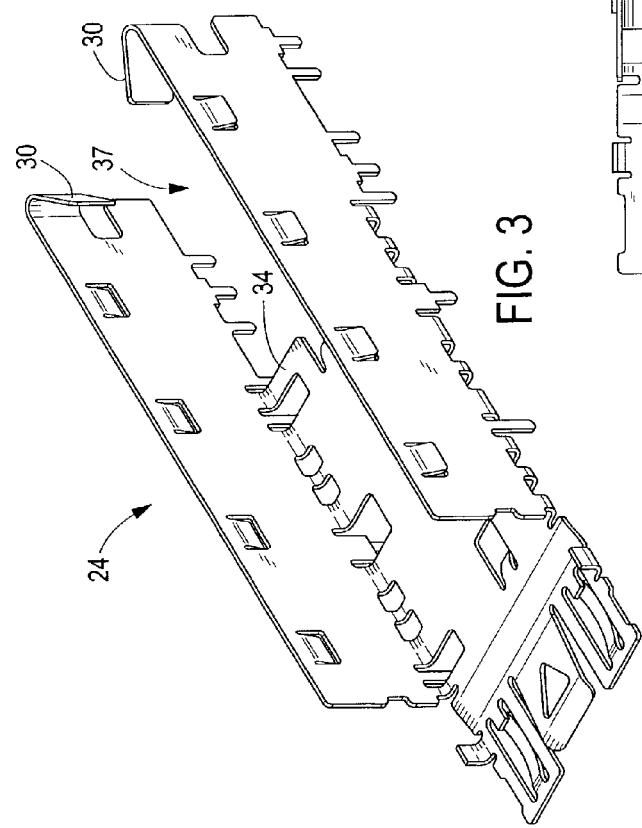
FIG. 3 shows a top perspective view of the lower portion of FIG. 2.

An important aspect of the receptacle and module system of the present invention is its ability to minimize EMI emission regardless of whether the module is plugged in the receptacle. To this end, the system employs a combination of one or more EMI reduction features. One EMI reduction feature is a receptacle housing having conductive walls on all sides that are within the host chassis when the receptacle is mounted therein. As shown in FIG. 1, the receptacle comprises a housing 21, having a front 31, aback wall 32, a top wall 33, a bottom wall 34 (see FIGS. 2 & 3), and side walls 35, and defining a cavity 36 for receiving the module 40. Referring to FIGS. 2 & 3, the bottom wall 34 has a bottom opening 37 to receive a receptacle connector 90 and, referring back to FIG. 1, the front 31 has a front opening 38 to receive the module. Therefore, unlike conventional receptacles, the receptacle of present invention has EMI shielding on all five sides within the host chassis, including the bottom and back. In a preferred embodiment, the back wall fully encloses the back of the receptacle and the bottom wall covers more than 50% of the bottom of the receptacle.

The receptacle comprises a plurality of elongated connection members 70 which extend down from the housing past the bottom wall and are electrically connected to the housing. Accordingly, rather than allowing internally-generated EMI to escape though the bezel, the EMI is blocked by the conductive walls of the housing and conducted harmlessly to ground via the connection members 70.

Figure 4:
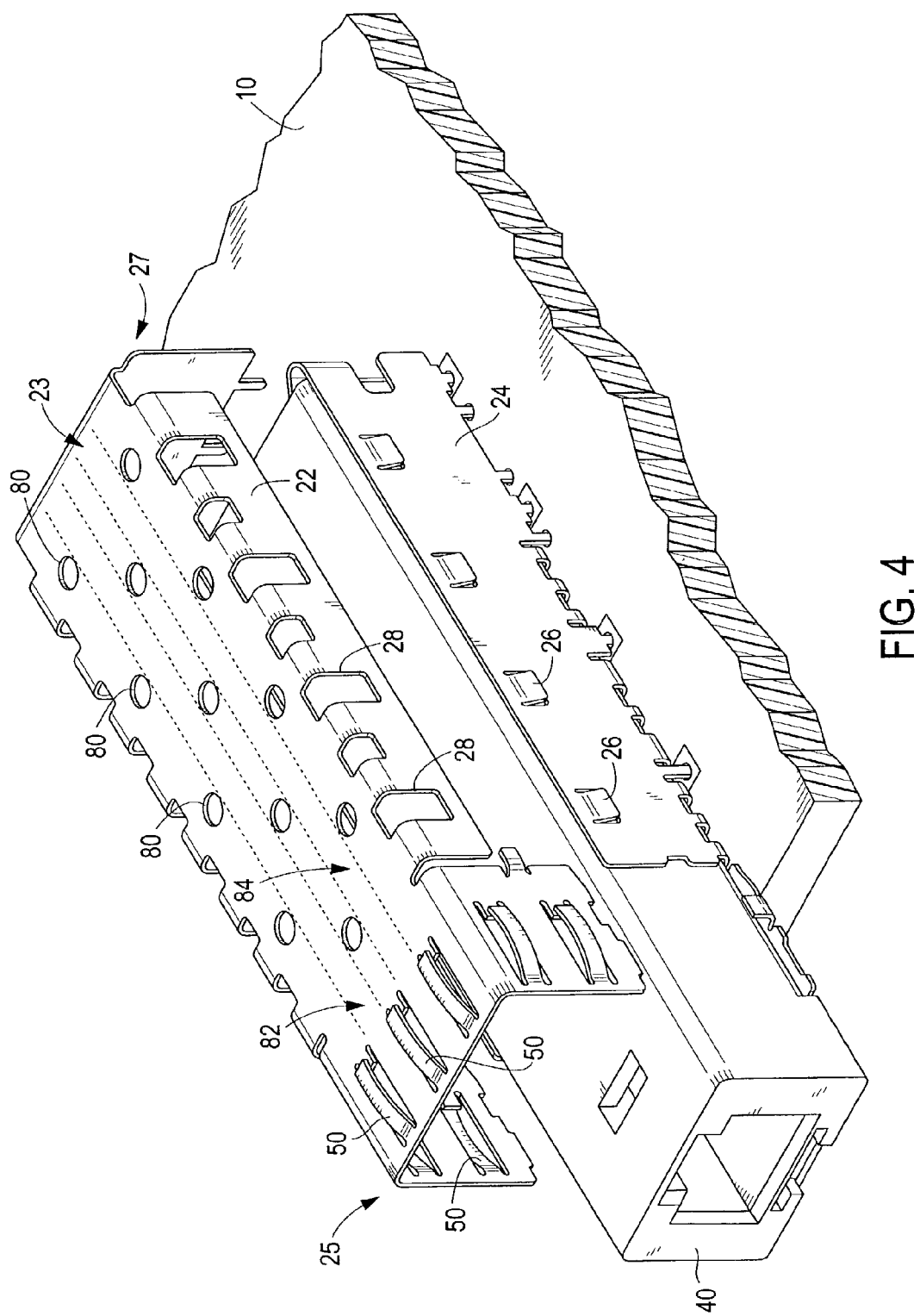
FIG. 4 shows a top perspective view of a module as mounted in a lower portion of the shield, with an upper portion shown removed.

In a preferred embodiment, the housing comprises an upper portion 22 and a lower portion 24, as shown in FIG. 4. The lower portion 24 has tabs 26 punched from the lower portion 24 and deflected outwardly for mating and latching with openings 28 defined by the upper portion 22.

The walls are configured to balance the needs of EMI shielding and heat dissipation. More specifically, as shown in FIGS. 1 and 4, the top wall 33 of the upper portion 22 of the housing 21 defines several holes 80. The holes 80 are sized and configured to promote airflow around the module 40 and enhance heat dissipation. Although enlarging the holes 80 enhances heat dissipation, it reduces the EMI shielding effectiveness of the upper portion 22 which is undesirable. It has been found that holes of approximately 2 to 3 mm in diameter provide adequate heat dissipation for many applications while maintaining adequate EMI shielding for the frequencies of operation.

As mentioned above, the receptacle 20 has elongated connection members 70 which are preferably solder pins for mounting and electrically coupling the receptacle 20 to contacts 12 of a printed circuit board 10 as shown in FIG. 1. Additionally, the receptacle 20 has containment members 72 extending from the portion into a plane of the printed circuit board 10. The containment members 72 are not electrically coupled to the printed circuit board 10. The containment members 72 may be positioned where suitable so as not to interfere with traces (not shown) of the printed circuit board 10, although the containment members 72 are advantageously spaced among the connection members 70 and generally in alignment therewith, as shown in FIG. 1. In effect, the connection members 70 and containment members 72 act as a fence to contain EMI. In the embodiment shown in FIG. 1, the containment members 72 and connection members 70 are more closely spaced adjacent the back end than adjacent the front end of the module 40 to compensate for the bottom opening 37.

Preferably, the connection members 70 are asymmetrically arranged on each side of the receptacle while the containment members 72 are symmetrically arranged. Furthermore, the containment members 72 preferably extend through less than half of the thickness of the printed circuit board 10. In such a preferred embodiment, two housings may be mounted directly opposed to one another on opposite sides of a printed circuit board in a bottom-to-bottom arrangement such that the connection members will be staggered and will not interfere with one another while the containment members will share the same openings in the printed circuit board but will not contact one another or become electrically coupled.

Figure 6:
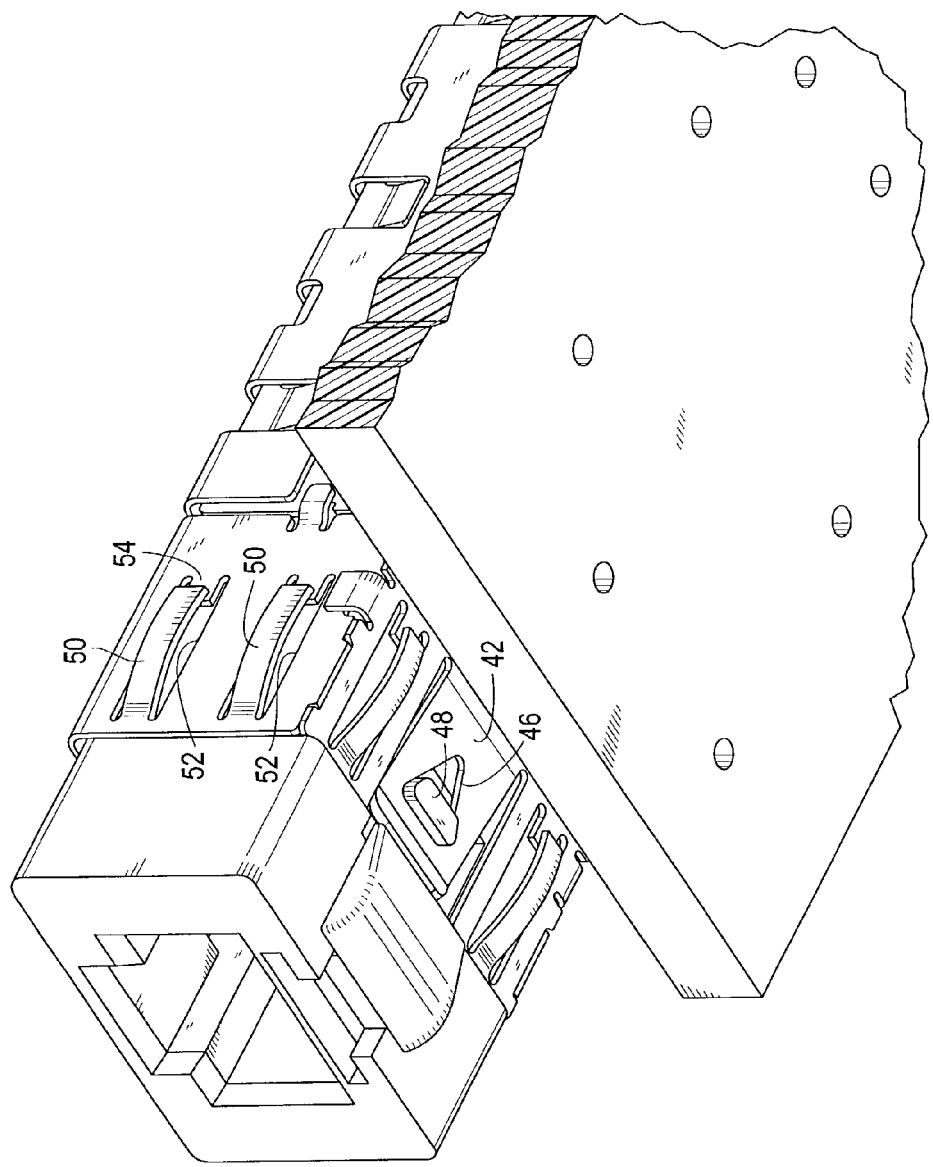
FIG. 6 shows a bottom perspective view of the module latched to the shield.

Another EMI reduction feature of the present invention comprises a multiplicity of grounding tabs surrounding the front opening 38 of the receptacle 20 to ground the receptacle to the host system. Grounding the receptacle to the host system at the bezel is important for EMI purposes—otherwise, internal EMI will "leak" between the gap of the receptacle and the bezel opening. Although grounding shields have traditionally been used to minimize this leakage, once the module 40 is mounted in the receptacle 20 as shown in FIG. 6, there is little or no room for intrusion of grounding tabs into the cavity 36 of the receptacle 20. Accordingly, the receptacle 20 of the present invention has grounding tabs 50 which are larger than adjacent openings 52 in the housing and thus are prevented from being deflected into the cavity 36.

Figure 5:
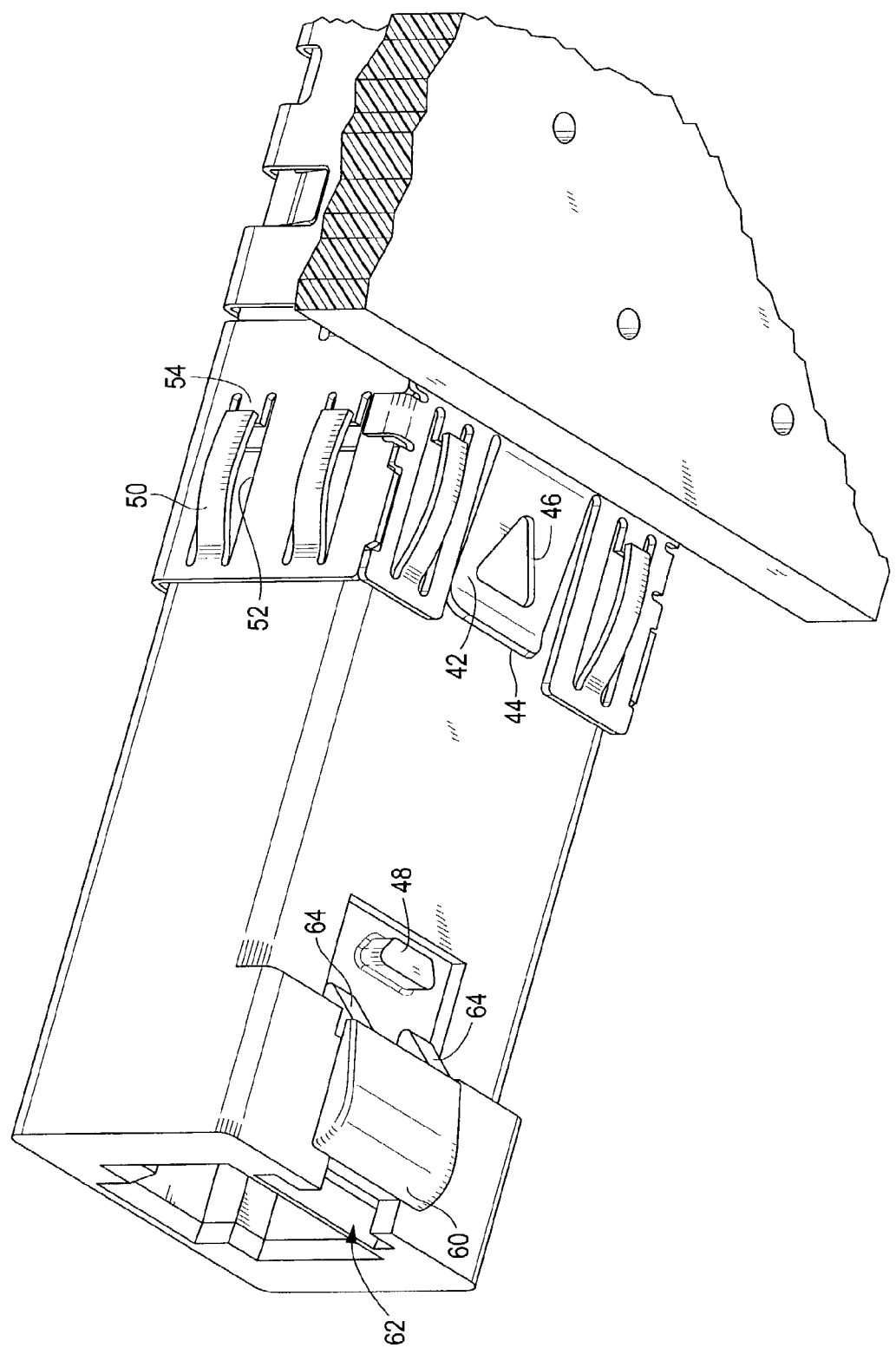
FIG. 5 shows a bottom perspective view of the module before latching to the shield.

The grounding tabs 50, as best shown in FIGS. 5 and 6, are preferably formed from the receptacle 20 by punching two spaced slits in the receptacle 20 to form a strap therebetween, deforming and stretching the strap, cutting the strap along its length to form a grounding tab 50 and an interference tab 54, and returning the interference tab 54 to the plane of the receptacle 20. In this manner, the grounding tab 50 is larger than the adjacent opening 52, thereby allowing the grounding tab 50 to resiliently deflect to ensure good grounding contact with the bezel, but not to the extent of intruding into the cavity 36 of the receptacle 20 due to the interference of the grounding tabs 50 with the interference tabs 54.

The receptacle and module of the present invention also have features which cooperate with one another to minimize EMI emissions. In general, these features function to provide a grounding path from the module to the chassis. To this end, the module 40 has a number of grounding contacts 99 formed in its housing as shown in FIG. 9. The grounding contacts 99 provide a grounding path from the module to the receptacle, and the grounding tabs 50 on the receptacle 20, in turn, provide a grounding path from the receptacle 20 to the bezel of the host chassis.

To enhance the connection of the grounding contacts 99 to the receptacle, the holes 80 are aligned to provide a grounding track for the grounding contacts. As shown in FIG. 4, the holes 80 and module grounding tabs 50 are arranged such that two clear grounding paths 82, 84 extend from the front end 25 to the back end 27 of the top wall 33. This provides a clear path for continuous grounding of the module 40 to the housing 21, which is advantageous for EMI containment purposes. Specifically, the grounding contacts 99 on module 40 are spaced to make contact along the grounding paths 82, 84 in the interior of the receptacle 20. The grounding contacts will maintain grounded contact with the receptacle 20 while the module 40 is being inserted into the receptacle 20.

The grounding of the module to the receptacle is further enhanced by the retention mechanism. As shown in FIGS. 5 & 6, a latch 42 on the receptacle 20 is configured to engage a latching member 48 on the module 40 and hold the module in the receptacle until the latch is released. Preferably, the latch and latching member are conductive such that the latch not only serves to retain the module but also provides yet another grounding path for the module. The placement of the latch under the module where there are no grounding contacts also provides additional "pickets" in the EMI fence as discussed above. The retention mechanism is discussed more specifically below with respect to the ejection mechanism.

Figure 7:
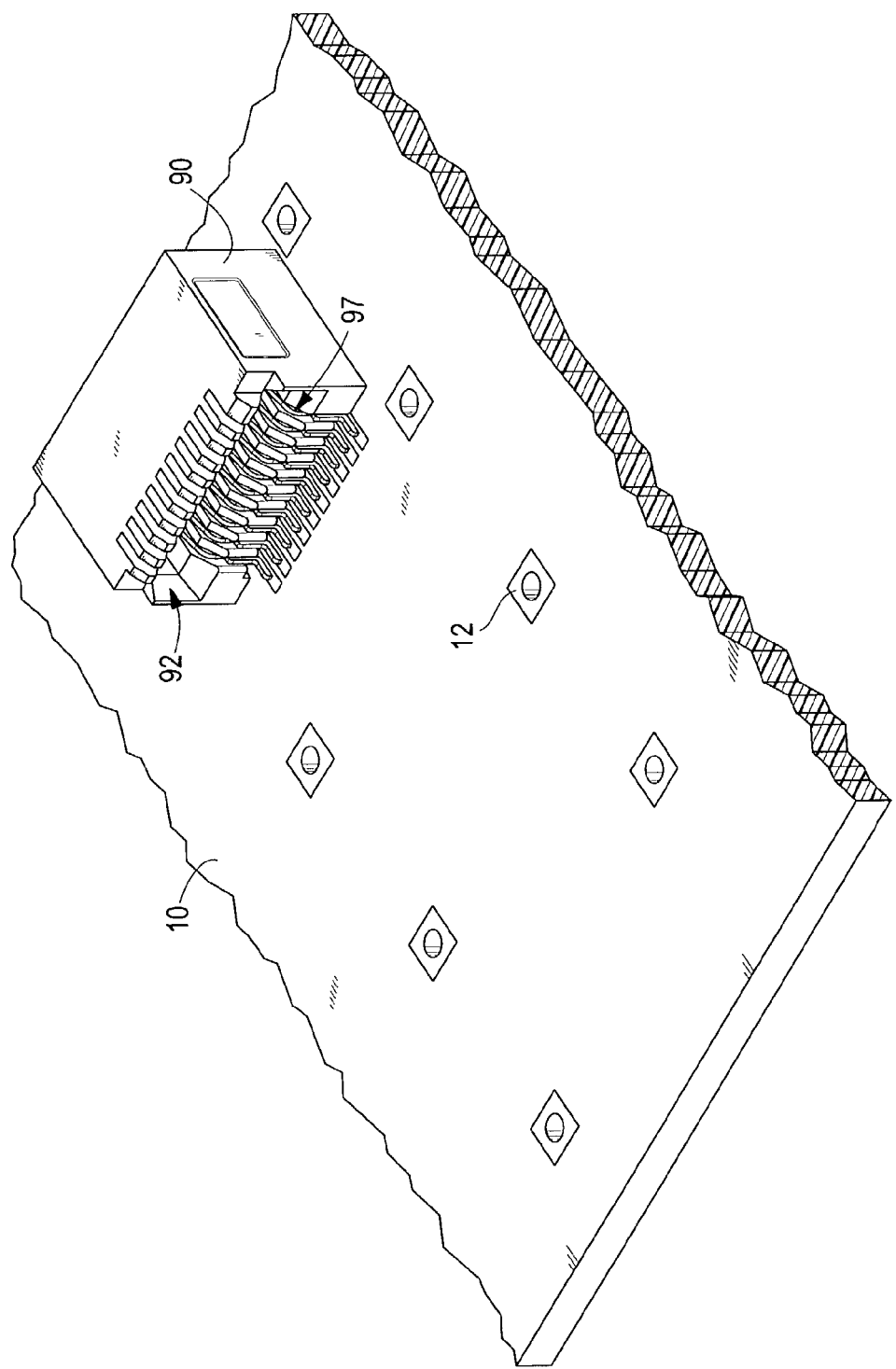
FIG. 7 shows a top perspective view of the host circuit board with a mating connector.

Aside from its EMI and grounding features, the module and receptacle system of the present invention also has a number of mechanical features that enhance its usefulness and make it particularly well suited for miniaturization. One such feature is the use of a card edge connector rather than a conventional discrete connector to electrically connect the module to the receptacle connector. More specifically, as shown in the embodiment of FIGS. 7, 8a and 8b, the receptacle connector 90 is adapted for mounting to the circuit board 10 within the boundaries of the receptacle 20 and has a slot 92 for receiving an edge portion 94 of a module circuit board 96 mounted within a housing of the module 40. The edge portion 94 has a row of contact pads (not shown) along the upper and lower sides of the printed circuit board. The receptacle connector 90 preferably has two rows of contacts, one row of contacts 97 extending upward into the slot 92 and another row of contacts 98 extending downward into the slot. The contacts are adapted to make an electrical connection with the contact pads on the module circuit board 96 when the module 40 is inserted into the receptacle 20. This card edge connector arrangement eliminates the need for a bulky and costly discrete connector and instead provides a low-profile connection that facilitates miniaturization. In addition, this arrangement allows for a pluggable module that may be readily connected and disconnected, e.g., during assembly or for subsequent service.

In one embodiment, the length of the contact pads and/or their proximity to the edge portion of the module circuit board 96 is varied to control the order in which the contact pads electrically couple to the receptacle connector 90. For example, a grounding contact pad could be extended to the edge of the circuit board 96 to ensure that it makes contact with the receptacle connector 90 before the remaining contact pads, which could be spaced from the edge of the circuit board 96 to ensure subsequent contact. In other words, the pads can be staggered to effect a desired sequencing in the ground, power and signal connections. Alternatively, the contacts within the receptacle connector may be staggered to achieve the desired sequencing.

To facilitate miniaturization, the module and receptacle system of the present invention also employs ejection/retention mechanisms which do not add additional components to the system but synergistically use components of the receptacle. More specifically, portions of the lower portion 24 are bent inwardly to form resilient fingers 30 extending into the cavity 36 of the housing 21, as shown in FIGS. 2 and 3. As a module 40 is inserted into the housing 21, as shown in FIG. 4, a back portion (not shown) of the module 40 contacts the resilient fingers 30 and deflects them outwardly. As shown in FIG. 5, the receptacle 20 includes a latch tab 42 having an inclined leading edge 44 and defining an opening 46. As the module 40 is further inserted, the leading edge 44 rides over an outwardly extending latching member 48 of the module 40, causing the latch tab 42 to be resiliently deflected, until the latching member 48 is positioned to enter the opening 46, at which time the latch tab 42 resiles, or snaps back, and latches the module 40 to the receptacle 20, as shown in FIG. 6.

In one embodiment, the latching member 48 is configured as a shear pin to prevent damage to the housing in the event of excessive force exerted on the module 40, e.g., by pulling on a cable attached thereto. This may be achieved, for example, by fabricating the latching member of an appropriate material or by sizing of the latching member to achieve the desired shear characteristics. In this embodiment, the latching member 48 will break and prevent damage to the housing and the printed circuit board on which the housing is mounted.

The resilient fingers 30 resist insertion of the module 40 and store energy as they are deflected outwardly until the module 40 is latched to the receptacle 20. The module 40 may be released from the receptacle 20 by operating an actuator 60 of the module, as shown in FIG. 5. The actuator 60 is slidably mounted in a channel 62 of the module 40 and has a ramped portion 64 for deflecting the latching tab 42 by causing the leading edge 44 to be lifted until the latching member 48 is released from the latching tab 42. The resilient fingers 30 then resile and cause the module 40 to be at least partially ejected from the receptacle 20. This facilitates removal of the module from the receptacles and disconnection of the module from the receptacle connector 90.

In this manner, the invention provides a robust pluggable connector suitable for miniaturization and use in high-frequency data transmission applications by providing adequate EMI shielding, reliable, non-intrusive chassis grounding, adequate ventilation, and conventional pluggability.

What is claimed is:

1. A receptacle for mounting to a first circuit board and for receiving a module containing a second circuit board and having a front portion with a latching member, said receptacle comprising:
   an electrically conductive housing having a top wall, a bottom wall, side walls and a back wall and defining a cavity, said cavity being sized to receive essentially the entire portion of the module containing said second circuit board, the housing having elongated members which are configured to make electrical connection with the first circuit board, the housing having an open front for receiving the module into the cavity, and the housing having a resilient latch tab adjacent to said open front that cooperates with said latching member on said front portion of said module to secure said module in the cavity.

2. The receptacle according to claim 1 wherein the resilient latch tab has an inclined leading edge that is deflected by the latching member as the module is inserted into the cavity.

3. The receptacle according to claim 1 wherein the resilient latch tab has an opening that receives the latching member when the module is disposed in the cavity.

4. The receptacle according to claim 1 wherein the resilient latch tab is electrically conductive and is integrally formed with the housing.

5. The receptacle according to claim 1 wherein the bottom wall is configured to extend parallel to the first circuit board, and the resilient latch tab extends from the bottom wall.

6. The receptacle according to claim 5 wherein the bottom wall has an opening that is configured to receive a receptacle connector that is mounted on the first circuit board.

7. A receptacle for receiving a module therein, said receptacle comprising:
   an electrically conductive housing having a top wall, a bottom wall, side walls and a back wall defining a cavity, the bottom wall having an opening that is configured such that a receptacle connector that is mounted on a circuit board can be received through the opening and into the cavity as the housing is mounted on the circuit board, the housing having elongated members which are configured to make electrical connection with the circuit board, the housing having an open front for receiving the module into the cavity, and the housing having a resilient latch tab that cooperates with a latching member on the module to secure the module in the cavity.

8. The receptacle according to claim 7 wherein the resilient latch tab is disposed adjacent to the open front of the housing.

9. The receptacle according to claim 7 wherein the resilient latch tab has an inclined leading edge that is deflected by the latching member as the module is inserted into the cavity.

10. The receptacle according to claim 7 wherein the resilient latch tab has an opening that receives the latching member when the module is disposed in the cavity.

11. The receptacle according to claim 7 wherein the resilient latch tab is electrically conductive and is integrally formed with the housing.

12. The receptacle according to claim 7 wherein the resilient latch tab extends from the bottom wall.

13. The receptacle according to claim 1, wherein said module comprises a module housing containing said second circuit board and a connector interface disposed at the front of said module housing.

14. The receptacle according to claim 13, further comprising said module.

* * * * *